United States Patent [19]

Kastalsky

[11] Patent Number: 5,793,055
[45] Date of Patent: Aug. 11, 1998

[54] HYBRID ELECTRONIC DEVICES, PARTICULARLY JOSEPHSON TRANSISTORS

[75] Inventor: Alexander Kastalsky, Way Side, N.J.

[73] Assignee: Forschungszentrum Julich GmbH, Julich, Germany

[21] Appl. No.: 564,965

[22] Filed: Nov. 30, 1995

[51] Int. Cl.⁶ .................. H01L 29/06; H01L 31/0328; H01L 31/0256; H01L 39/22
[52] U.S. Cl. .................. 257/24; 257/25; 257/31; 257/39; 257/192; 257/194; 257/623; 257/624; 505/190; 505/191; 505/193; 505/237
[58] Field of Search .................. 257/24, 25, 37–39, 257/622–624, 192, 194; 505/190, 191, 193, 237

[56] References Cited

U.S. PATENT DOCUMENTS

| | | | |
|---|---|---|---|
| 5,106,822 | 4/1992 | Tamura | 505/191 |
| 5,219,834 | 6/1993 | Usuki et al. | 505/330 |
| 5,318,952 | 6/1994 | Hato | 505/193 |
| 5,358,928 | 10/1994 | Ginley et al. | 505/192 |
| 5,519,232 | 5/1996 | Park et al. | 257/192 |
| 5,550,388 | 8/1996 | Haruyama | 257/24 |
| 5,552,374 | 9/1996 | Tanaka et al. | 505/193 |

FOREIGN PATENT DOCUMENTS 2-192172  7/1990  Japan .

*Primary Examiner*—Mahshid D. Saadat
*Assistant Examiner*—Allan R. Wilson
*Attorney, Agent, or Firm*—Herbert Dubno

[57] ABSTRACT

A step junction is provided for superconductor/semiconductor heterostructure hybrid devices like tunneling transistors, in a body of p-InAs with a vertical side connecting the low plateau and high plateau on which superconductors, preferably of niobium, are applied.

3 Claims, 8 Drawing Sheets

1

HYBRID ELECTRONIC DEVICES, PARTICULARLY JOSEPHSON TRANSISTORS

FIELD OF THE INVENTION

My present invention relates to hybrid devices and especially Josephson transistors, utilizing a unique channel structure and, more particularly, to a superconductor/semiconductor heterostructure hybrid electronic devices utilizing a two-dimensional inversion layer.

BACKGROUND OF THE INVENTION

Electronic devices utilizing the InAs structure have been proposed in which the InAs serves as a material for fabrication of weak links in SNS sandwiches (see H. Takayanagi and T. Kawakami Phys. Rev. Lett. 54, 2449, 1985; C. Nguyen, H. Kroemer, and E. L. Hu Appl. Phys. Lett. 57, 87, 1990; and H. Kroemer, C. Nguyen and E. L. Hu Solid St. Electr. 37, 1021, 1994).

Electronic devices of this type utilize the high mobility inversion layer arising due to pinning of the Fermi level at the surface above the conduction band edge which leads to the absence of a Schottky barrier and thus barrier-free flow of electrons across the SN interface.

Small electron effective mass (0.024 $m_o$) and high electron mobility ensure a large coherence length $\xi$ for penetration of the Cooper pairs into the semiconductor ($\xi$ is >100 nm) which allows high critical current Ic through macroscopic weak-link distances.

In previous work with InAs-based devices, the contacts always lie in a single plane and a spacing of 0.3 to 0.5 μm was provided between the planar contacts deposited on the InAs surface.

OBJECTS OF THE INVENTION

It is the principal object of the present invention to provide an improved channel structure for electronic devices utilizing the InAs system and, especially, superconductive/semiconductive heterostructure hybrid devices utilizing the new channel structure with increased versatility.

Another object of the invention is to provide improved Josephson transistors and, in particular, Josephson transistors with ratios of $V_{out}/V_g$ approaching unity.

Still another object of the invention is to provide improved transistors free from drawbacks of earlier systems.

SUMMARY OF THE INVENTION

I have found that the versatility and quality of the InAs-based devices utilizing an inversion layer as a channel, can be greatly enhanced by providing a step structure such that the contacts lie in different planes and a substantially vertical side of the InAs body is provided between these planes. More particularly, a superconductive/semiconductive heterostructure hybrid electronic device according to the invention comprises:

an InAs body with a stepped shape having a high plateau, a low plateau and a step side transverse to the plateaus and connecting same, the InAs body having a continuous surface inversion layer underlying the low plateau, extending along the side and underlying the high plateau;

a first superconducting layer on the high plateau; and a second superconducting layer on the low plateau whereby an electron-conducting channel is formed between the superconducting layers through the inversion layer.

To understand the significance of the invention, mention may be made of a prior art superconducting hybrid transistor of the Josephson field effect transistor (JOFET) type in which the gate bias changes the supercurrent through a conventional variation of the electron density in the channel (see for example, T. Nishino, M> Miyake, Y. Harada and U. Kawabe IEEE EL Dev. Lett. 6, 297, 1985; A. W. Kleinsasser, T. Jackson, D. McInturf, G. Pettit and J. Woodall Appl. Phys. Lett. 55, 1909, 1989).

The resulting effect of current modulation in a JOFET is typically 10 μA per $V_g$=1 V. The transconductance is $G=I_c/dV_g \approx 10^{-4}$ S/1 mm with a best result of about $10^{-2}$ S/mm (T. Nishino, M. Miyake, Y. Harada and U. Kawabe IEEE EL Dev. Lett. 6, 297, 1985) while the output voltage changes form zero to $V_{out}$ which usually is orders of magnitude less than $V_g$. To have a practical Josephson FET, G must be dramatically increased to obtain a value $V_{out}/V_g$ close to unity and I have now found that with the stepped shape of the channel, transistors can be constructed which will approach this value. The step junction can be utilized in a Josephson tunneling transistor (JTT) or in a resonant tunneling transistor (RTJT). These transistors can be utilized in the fabrication of a hybrid SQUID, in RSFQ and Josephson array technologies.

Characteristics of the step junctions of the invention are very narrow N regions (<≈100 nm), potentially high critical currents and low capacitances, simple manufacturing techniques since no electron beam lithography is necessary and the possibility of channel orientation normal to the growth direction which allows formation of any required potential profile along the channel simply by growing an appropriate heterostructure.

According to a feature of the invention, the body of the hybrid electronic device is composed of p-InAs. For use of the stepped junction in a transistor, a gate is provided for controlling electron flow along the channel, the gate being either a conductor embedded in the InAs body or a conductor disposed along the vertical side and insulated from the side and the Nb layers by an insulator layer.

According to a feature of the invention an n+InAlAs layer is regrown on the side between the plateaus thereby removing the inversion layer at the step region. In this embodiment a p+δ-doped layer is grown in the InAs p-type structure to provide a conductance modulation at the side portion of the channel. A conductor can be embedded in the InAs body to form a gate electrode in contact with the p+δ-doped layer whereby the device forms the Josephson tunneling transistor, as will be described later.

According to another aspect of the invention, the device can comprise strained $In_{0.77}Ga_{0.23}As$ or AlSb/InAs lattice matched layers buried in the body below the inversion layer of the high plateau, interrupting the inversion layer along the side, while gate action is accomplished either by a p+δ-doped region grown beside the p-InAs or by side, metal-on-insulator, gating.

A quantum well (with its barriers) can be embedded in the InAs body in contact with the p+δ-doped regions and can constitute a resonant tunneling Josephson transistor as will be described in greater detail hereinafter.

The transistors of the invention can operate also in a nonsuperconducting mode, and especially the resonant tunneling Josephson transistor can utilize one-dimensional electron gas both at the emitter and at the quantum well. In this case one-dimensional to one-dimensional tunneling can take place.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
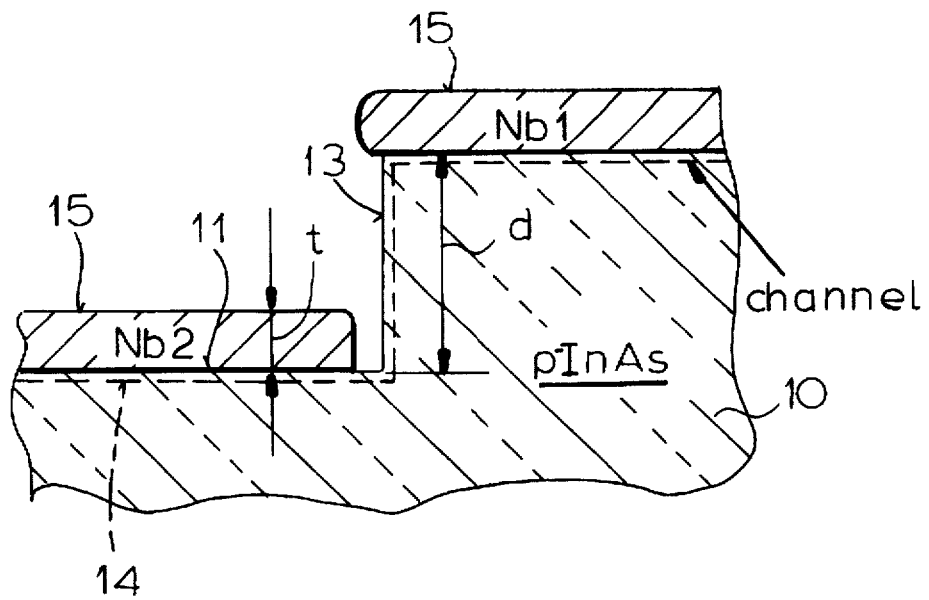
FIG. 1 is a cross sectional view of the stepped junction according to the present invention which can be utilized in the fabrication of Josephson-type transistors.

In FIG. 1 I have shown a p-InAs body 10 which is formed, as will be described in greater detail hereinafter, with a lower plateau 11 and a high plateau 12 connected by a vertical side 13 to define the step geometry of SNS junction. A two-dimensional inversion channel is provided at 14 and runs continuously along the low plateau 11, the vertical side 13 and the high plateau 12. Conductors in the form of two-dimensional niobium layers 15 are provided on the low plateau and the high plateau and are represented at Nb1 and Nb2, respectively. The height of the vertical side 13 is shown as d.

The layer Nb1 is deposited on a clean surface of the p-InAs bodies. Then the InAs is etched to the depth of d–100 nm, and the layer Nb2 is deposited using the layer Nb1 as a shadow mask. Thus, etching provides a step-like shape of the surface channel in the SNS co-planar sandwich and essentially defines the weak link spacing d. To avoid a short between contacts, the Nb2 should be thinner than the etch depth (t<d)

While Nb has been specified as a superconductor above, other superconductors (such as NbN) can also be used.

The dashed line indicates the surface two-dimensional channel, –10 nm thick, going through the entire SNS structure. At low temperatures, this channel is the only conducting path in the device due to the hole freeze-out in the InAs bulk. Co-planar SNS geometry ensures low device capacity and hence absence of a hysteresis in the I-V characteristic. This simple technology, not requiring electron beam lithography, is capable of fabricating weak links with the intercontact spacing d=40 nm or less (A. Kastalsky, R. Bhat, A. Y. Cho, and D. Sivco J.Appl.Phys. 74, 2813, 1993). In the proposed device, however, the limitation on the etching depth will be imposed by a superconducting quality of the Nb2, which typically decreases as the layer becomes thinner.

Thus, SNS hybrid structures with extremely narrow N regions can be made using this technique. Since this distance is much shorter than the electron mean path I ($\approx$0.5 µm), a clean limit regime with a ballistic propagation across the sample can be realized. In addition, the step-like shape of the channel, which is oriented normal to the growth direction, makes it possible to create different potential profiles along the channel, thereby providing an opportunity for designing novel two- and three-terminal devices. Such an approach will be utilized below for the two new Josephson transistors. As has been shown in A. W. Kleinsasser, T. Jackson, D. McInturf, G. Pettit and J. Woodall Appl. Phys. Lett. 55, 1909, 1989, the Nb (2D channel) Nb sandwiches are capable of providing a rather high value of $I_cR_n$ product of ~1 mV ($I_c$ is the critical current amplitude and $R_n$ is the resistance in the normal state). This parameter is extremely important for SQUID, RSFQ and Josephson array technologies.

Figure 2:
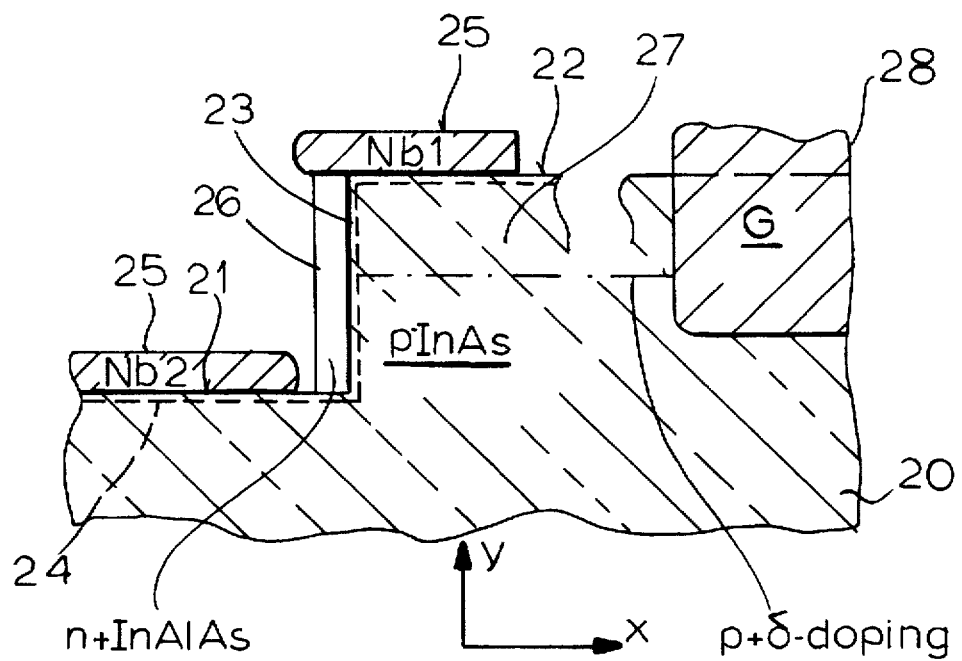
FIG. 2 is a cross sectional view showing the use of the stepped junction of FIG. 1 in a Josephson tunneling transistor.

FIG. 2 shows a Josephson tunneling transistor which utilizes the step geometry of the SNS junction of FIG. 1. In this transistor, the p-InAs body 20 has a low plateau 21 and the high plateau 22 connected by the vertical side 23 and the continuous two-dimensional inversion channel 24 as has previously been described. Here, however, as will be discussed in greater detail, in addition to the niobium terminals Nb1 and Nb2, referred to as transistor terminals 25, a layer 26 of n+InAlAs or AlSb is grown along the side 23 and runs to the terminals 25. Formed in the p-InAs body 20 is p+δ-doped layer 27 and anchored in this body is the gate terminal 28 represented as G and extending above the plane of the high plateau 22. There are two major contributions, therefore, in the Josephson tunneling transistor of FIG. 2 over the step-like geometry of FIG. 1

First, a 20 nm-thick, high energy gap, n+InAlAs (or AlSb, lattice matched to InAs) layer is regrown on the vertical side of the InAs surface, n+ charge is placed in the middle of this layer to provide an electron density at the interface channel. Such a modulation doping approach removes Fermi level pinning at the surface, so the channel density becomes a function of the doping level in the regrown high-gap material and can be easily held in the range of $10^{11}$–$10^{12}$ cm$^{-2}$. Reliable, in situ, cleaning procedures (prior to regrowth) have been developed, and a high mobility 2D gas at the regrown interface has been obtained in the GaAs/AlGaAs system (J. E. Cunningham Proc. MRS Meeting, 1993).

A new resonant tunneling transistor employing surface regrowth has been proposed in S. Luryi and F. Capasso Appl. Phys. Lett. 47, 1347, 1985 and realized experimentally (A. Zaslavsky, D. Tsui, M. Santos and M. Shayegan Appl. Phys. Lett. 58, 1440, 1991 and C. Kurdak et al Appl. Phys. Lett. 64, 610, 1994). Finally, a new regrown FET structure, with the gate electrode as a layer in the originally grown heterostructure, has been demonstrated (H. L. Stormer, K. Baldwin, L. Pfeiffer and K. West Appl. Phys. Lett. 59, 111, 1991). The devices reported in A. Zaslavsky, D. Tsui, M. Santos and M. Shayegan Appl. Phys. Lett. 58, 1440, 1991 and C. Kurdak et al Appl. Phys. Lett. 64, 610, 1994; and H. L. Stormer, K. Baldwin, L. Pfeiffer and K. West Appl. Phys. Lett. 59, 111, 1991 employed in situ wafer cleaving prior to regrowth.

Such a regrowth procedure is an important element for implementation of the new transistors discussed below.

Figure 3A:
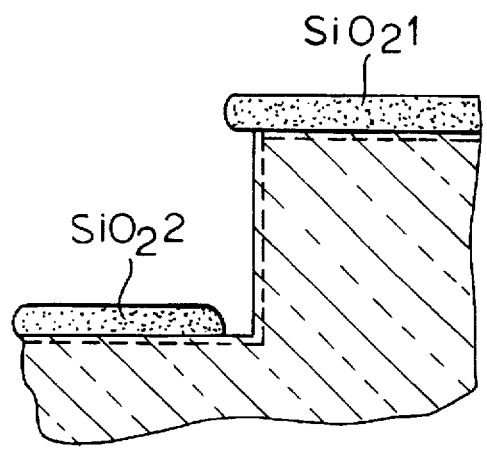
FIG. 3A is a cross sectional view illustrating a step in the formation of the Josephson tunneling transistor of FIG. 2 prior to the application of the niobium contacts.
Figure 3B:
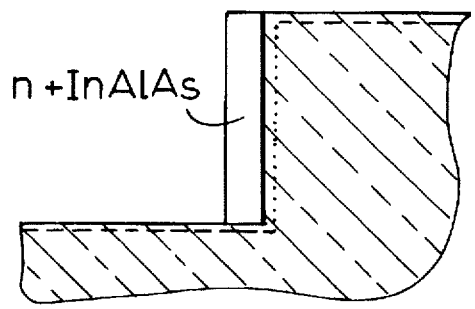
FIG. 3B is a fragmentary section showing a subsequent stage.
Figure 3C:
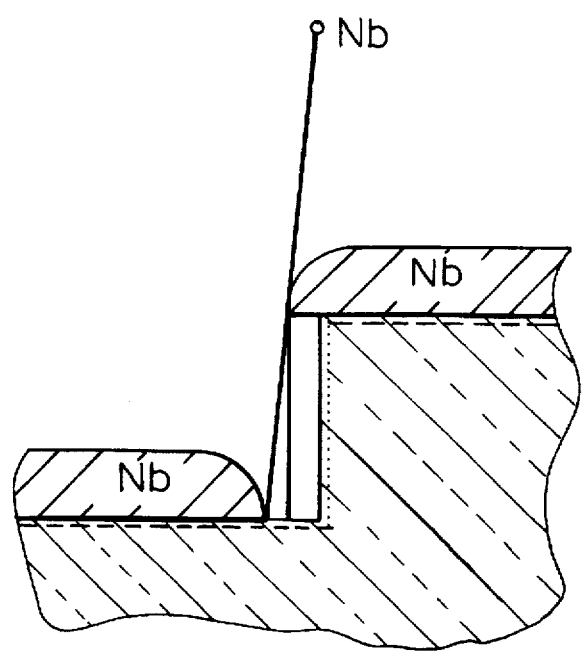
FIG. 3C is a fragmentary cross sectional view showing the stage of deposition of the niobium contacts.

The first layer to deposit on the p-InAs is an insulator $SiO_2 1$, followed by etching of the step-like profile and deposition of a second insulating layer, $SiO_2$ using the shadow deposition technique (A. Kastalsky, R. Bhat, A. Y. Cho, and D. Sivco J.Appl.Phys. 74, 2813, 1993). (FIG. 3A). After cleaning and MBE regrowth of the side layer, the $SiO_2$ pads are etched away (FIG. 3B), thus exposing uncovered areas of the InAs, in which Nb is deposited in the beam deposition chamber for both contacts simultaneously (FIG. 3C). As a result of the regrowth the electron density at the $n^+$InAlAs/InAs interface becomes relatively low ($\leq 10^{12}$ cm$^{-2}$), and can be depleted by a gate action.

Another new feature of the device structure is the $p^+\delta$-doping grown in the middle of the vertical portion of the channel (FIG. 2). This implies existence of the barrier along the channel in its small area at the intersection of the interface $n^+$ channel with the horizontal $p^+$ sheet, the barrier amplitude being determined by doping levels in the $p^+$ and $n^+$ layers.

Figure 4A:
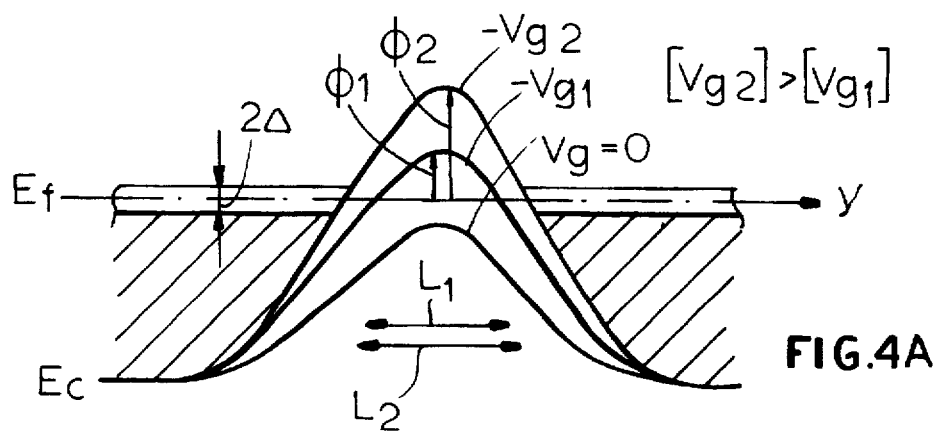
FIG. 4A is a diagram of the potential profile of the tunneling Josephson junction for different gate biases.
Figure 4B:
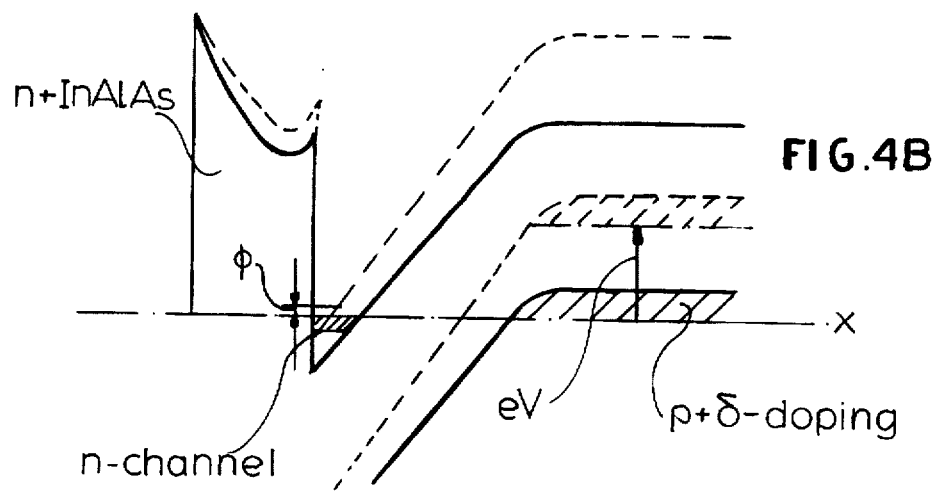
FIG. 4B is an illustration of the p-n junction at the intersection of the n-interface channel and p+ layer.

The band diagram at the surface channel is schematically shown in FIG. 4A. The Fermi level in the channel, measured from the conduction band edge $E_c$, is high everywhere except the intersection point, where the conduction band edge approaches $E_f$, or even goes above $E_f$, depending on the doping levels in the $p^+$ and $n^+$ layers, thus depleting the channel and forming a quasi-triangular barrier along the channel. Most importantly, the barrier amplitude $\phi$ can be varied by biasing a p-n junction existing between the n-channel and the $\delta$-doping sheet (see FIG. 4B). In particular, negative biasing of the $\delta$-layer relative to one of the contacts will increase the barrier height above the Fermi level and hence reduce conductance across the device. Thus, the contact to the $p^+$ layer serves as a gate to vary the barrier height. Furthermore, because of a quasi-triangular barrier shape, as shown in FIG. 4A, the gate induced modulation of the barrier height $\phi$ is accompanied by a change of the barrier width L, which greatly enhances the transconductance.

Due to a relatively high charge density in the channel ($\sim 10^{12}$ cm$^{-2}$) the total width L of the barrier can be very narrow, $\leq 40$ nm, and will be depending on the gate voltage $V_3$. Under these conditions, when the negative gate bias keeps the barrier amplitude at small values (<30 meV), tunneling along the channel will control the device conductance. Due to exponential dependence of the tunneling transmittance on the parameters $\phi$ and L, one can expect an extremely high sensitivity of the output current to the input gate voltage. In the discussed case of superconducting contacts, this will lead to appearance of a lateral Josephson tunneling across the SIS sandwich, with the supercurrent amplitude varied by the gate voltage.

Generally speaking, presence of the barrier in the channel is typical for an FET in the subthreshold regime (see e.g. S. M. Sze Physics of Semiconductor Devices 2d Ed. N.Y. 1981), where the channel conductance is governed by thermionic emission over the barrier. Uniqueness of the approach discussed here is that this barrier is extremely thin and thus allows efficient tunneling along the channel, while the gate bias varies both the height and the width of the triangular barrier.

Figure 4C:
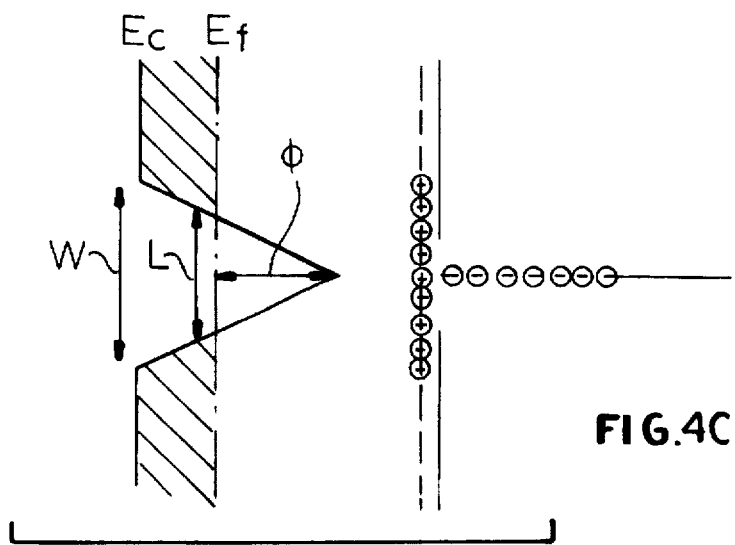
FIG. 4C is a diagram illustrating the donor and acceptor distributions in the p-n junctions as well as a simplified potential profile along the channel.

The doping level in the $p^+\delta$-sheet is dictated by two limiting requirements: It should be high enough to provide conductance along this layer. On the other hand, the doping density must be sufficiently low to prevent direct tunneling through the p-n junction. These limitations suggest the $\delta$-doping density in the range of $\approx 10^{12}$ cm$^{-2}$. Note also (see FIG. 4B and 4C) that the donors are located in the regrown layer, ~10 nm away from the p-n junction intersection. This will enhance the breakdown voltage as well as reduce the tunneling leakage. In FIG. 4C, the illustration on the left is a simplified potential profile along the channel. Donors are represented as + and acceptors as −.

Estimates of the device performance can be made. The supercurrent density is given by C. B. Duke, Tunneling in Solds, Academic Press, 1969.

$$I_s = 4\pi^2 (e\Delta m^* D_o E/h^3) \qquad (1)$$

where $\Delta$ is the superconductive gap for Nb, m* the electron effective mass and $D_o = \exp[-2L(2m^*\phi h^2)^{1/2}]$ is the tunneling transmittance of the lateral barrier. Thus, $L(\phi)^{1/2}$ is the parameter which controls the dependence of the supercurrent on the gate bias V. To determine this, one has to solve a problem of a two-dimensional potential profile, and its variation with the field, in the p-n junction, with p-and n-charges distributed linearly and normal to each other, as schematically shown in FIG. 4C. This is a rather complicated problem. For the sake of estimates, my calculation is limited to a parallel-plate p-n junction capacitor (see e.g. S. M. Sze Physics of Semiconductor Devices 2d Ed. N.Y. 1981) with an areal capacitance $C = \epsilon/W$ and total depletion layer width $W = [4\epsilon(V_b + V_g)/eN_c]^{1/2}$, where $N_c$ is the charge density at the p- and n-side, assumed to be equal, and $V_b$ is the build-in potential. L The tunneling barrier $\phi = 0$ is determined by the voltage $V_{th} = V_b + V_g$ needed to deplete the channel with an areal density n:

$$V_{th} = en/C = enW/\epsilon \qquad (2)$$

For $n = 1.10^{12}$ cm$^{-2}$ and $V_b = 0.5$ V in InAs (which includes the Fermi energies in the p- and n- layers) (Eq. (2) yields $V_{th} = 0.58$ V. Thus, above the gate bias $V_g = 0.08$ V (negative with respect to the channel) the potential $\phi > 0$ and tunneling begins. Total potential amplitude of the triangular barrier in FIG. 4C, $\phi + E_f$, for equal doping levels in p- and n- regions, is $$\phi + E_f = \frac{1}{2} e(V_{th} + V) \qquad (3)$$

where V is the gate voltage above the threshold, while the tunneling length $l = W\phi/(\phi + E_f)$. Combining these results one obtains for the product $L\phi^{1/2}$:

$$L\phi^{1/2} = (2\epsilon/e^2 N_o)^{1/2} \cdot [1 - 2E/e(V_{th} + V)]^{1/2} \cdot [e(V_{th} + V)/2 - E_f] \qquad (4)$$

An important result is that this product is higher than linearly proportional to V. Using $m^* = 0.024$ $m_o$, $E_f = 0.1$ eV and $\Delta = 1.5$ meV, one obtains for $I_s$:

$$I_s \approx 2.10^5 \exp\{-40[1 - 2E_f/(eV_{th} + V)]^{1/2} \cdot [e(V_{th} + V)/2 - E_f]\} A/cm^2 \qquad (5)$$

Figure 5:
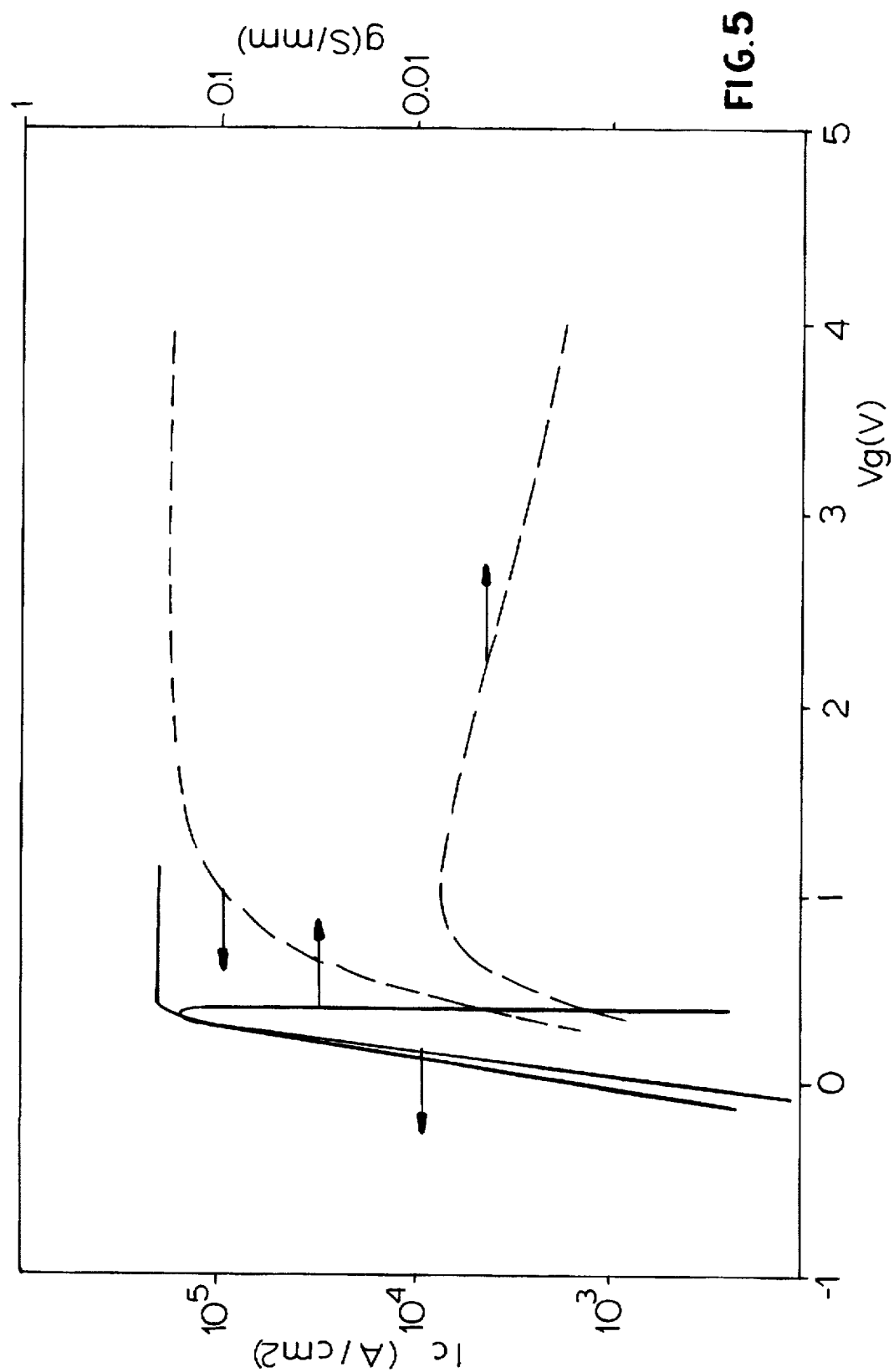
FIG. 5 is a plot of characteristics of the Josephson tunneling transistor of the invention versus the JOFET in its best performance to date.

FIG. 5 shows the dependence $I_sT(V)$ as well as the transconductance $g = DI_s/dV$ for the channel width of 10 nm. A sharp peak of the transconductance (per device width)

g=0.16 S/mm occurs at V=0.28 V. This implies a current modulation of ~1 mA in a 100 µm-wide device by the gate bias V≈60 mV. Dashed line illustrates the results obtained in the best JOFET to date (T. Nishino, M. Miyake, Y. Harada and U. Kawabe IEEE El.Dev.Lett. 6, 297, 1985). The total current density in this device was significantly lower than calculated above (probably due to a high contact resistance). For the sake of argument, however, to demonstrate a poor transconductance, the highest current density (at $V_g$=4 V) was normalized to the highest calculated current density of $2.10^5$ A/cm$^2$. One can see that even in this case the resultant transductance is ~30 times lower than that calculated for the JTT.

There are two basic reasons for the low JOFET sensitivity in comparison with the JTT of the invention. First is that the coherence lengths, which govern the exponential dependence of the JOFET current on the gate bias, $\epsilon \sim V^{1/2}$, in contrast with the JTT in which the exponent is proportional to $V^m$, m>1 (see Eq. (4)). The second reason originates from different mechanisms of the gate action: in the JOFET, the gate bias varies the Fermi level (measured from the conduction band edge) in the degenerate two-dimensional gas: $\delta E_f = \delta V_g C/D$ where C is the gate capacitance and D is the two-dimensional density of states. In the JTT, the gate bias affects the potential in the depleted area and variations of the potential $\delta\phi = \frac{1}{2}e\delta V_g$ (see Eq.(3)). The latter effect is much more efficient. For example, as was discussed above, the depletion of the degenerate 2∆ channel required the total voltage $V_{th}$=0.58 V, while the actual range of δV for the entire JTT operation (within which the current drops an order of magnitude) is only δV≈0.16 V. These two above discussed factors severely broaden the voltage scale in the dependence $I_s(V)$ of the JOFET thereby making it less efficient.

Figure 6:
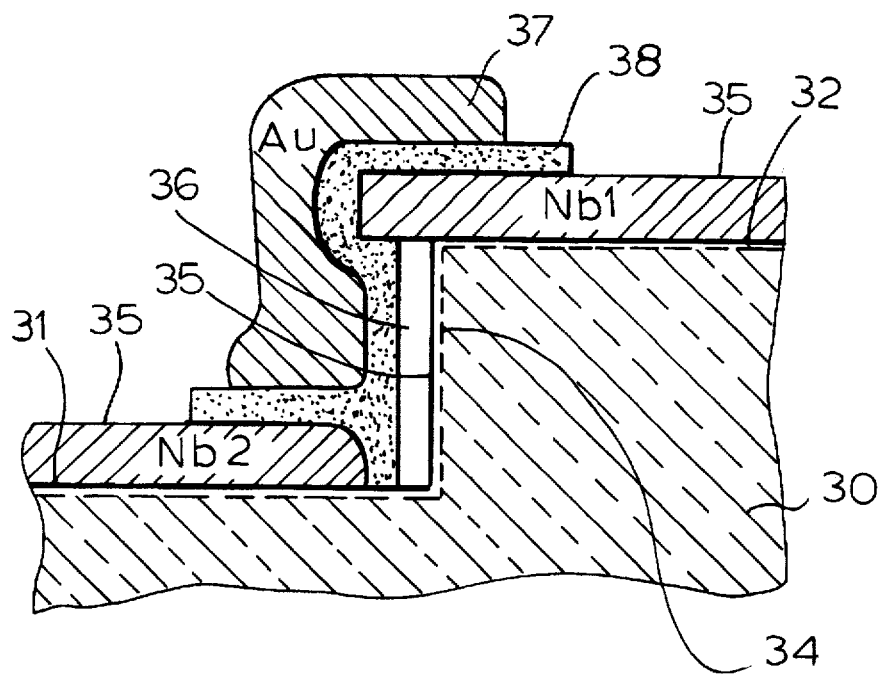
FIG. 6 is a cross sectional view through a portion of a side gate JTT.

An alternative way of applying the gate electrode to the JTT is shown in FIG. 6. In this embodiment, the step-like configuration of FIGS. 1 and 2 is used in that the InAS body 30 has a low plateau 31, a high plateau 32, contacts 35 represented at Nb1 and Nb2, an inversion layer 34 and a vertical side 35. As in the previous embodiments, the upper contact Nb1 overhangs the vertical side 35 and is bridged to the AlAs layer 36. The result is a side-gated Josephson tunneling transistor.

In this case, sputtering of a thin layer of an insulator 38 ($Si_o.Si_3N_4$ or $SiO_2$) on top of the device step region is followed by a metal deposition 37, thus providing a side device gating insulated from the side layer 36 and the terminals 35. In this approach, the barrier modulation is accomplished through variation of the Fermi level in the interface channel (rather than direct modulation of the barrier strength as described previously).

Finally, with the use of AlSb-InAs quaternary heterosystem, lattice matched to the InAs, it is possible to remove the surface inversion layer and incorporate a lateral triangular barrier into the InAs surface channel. In this case, there is no need for regrowth of the side high energy gap layer. Gate action can be realized through either p+δ-doping or side gating.

Thus the Josephson Tunneling Transistor has gate electrode modulation of the tunneling transparency through variation of both height and width of the barrier. The latter is introduced into the channel by growing a p+δ-doping layer inside pInAs bulk material. This becomes possible due to utilization of the step-like device geometry. The device has a high transconductance, significantly higher than that of the JOFETS.

Figure 7A:
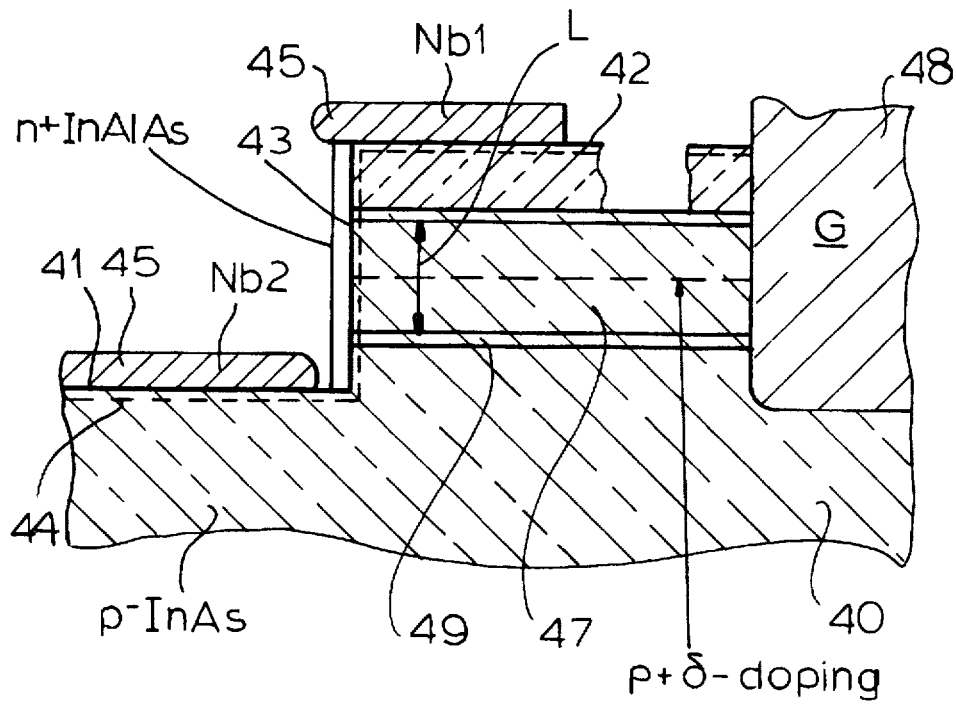
FIG. 7A is a cross sectional view similar to FIG. 2 but illustrating a resonance tunneling Josephson transistor.

FIG. 7A shows the basic construction of the resonant tunneling Josephson transistor utilizing the step junction concept. Here the p-InAs body 40 has a low plateau 41 and the high plateau 42, the vertical side 43, the inversion layer 44 and the niobium electrodes Nb1 and Nb2 collectively represented as 45. The gate electrode, as in the embodiment of FIG. 2, is shown as 48. In this embodiment, a double-barrier heterostructure is provided in which the p+δ-doping gate layer, is sandwiched between two InAlAs (AlSb) layers 49 forming a double barrier resonant tunneling potential profile as will be discussed in greater detail.

The layer structure is shown in FIG. 7A. Two additional 1.5 nm-thin InAlAs (AlSb) barriers are inserted above and below the p+δ-doping sheet, making a double barrier resonant tunneling potential profile along the channel. The p+δ-doped layer lies in the middle of a ~20 nm-wide InAs quantum well (QW) and thus provides a potential variation in the QW by an external electrode. As in the case of a JTT, the regrown layer of the high gap material is present at the side region of the channel to remove the Fermi level pinning.

Figure 7B:
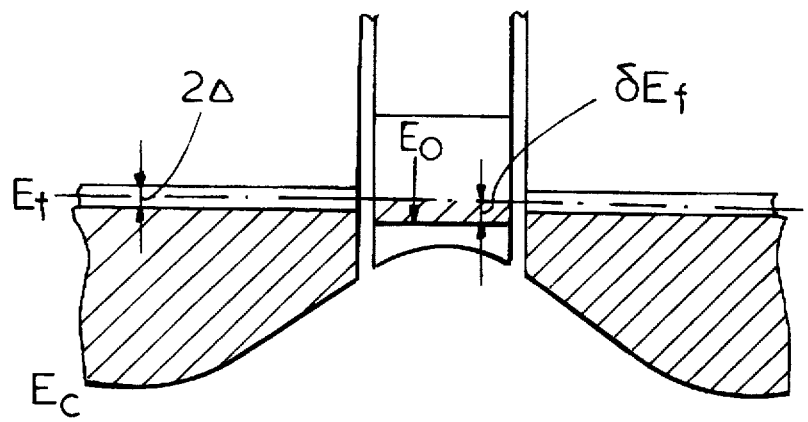
FIG. 7B is a diagram of the energy profile along the channel in the quantum well (QW) region thereof.
Figure 7E:
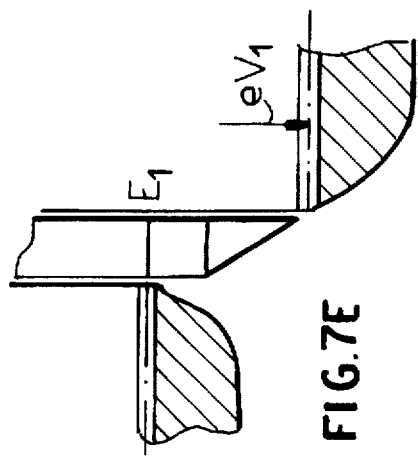
FIG. 7E is a band diagram of the second resonance.

FIG. 7B shows a sketch of the energy band diagram along the surface. The emitter and the collector are two-dimensional channels, while the QW is quantized in two directions and thus is one dimensional. Direct access of the δ-layer to the QW produces energy variation of the ground state level $E_0$ in the QW when bias is applied to the p-n junction existing at the intersection of the p+layer with the channel (i.e. in the middle of the QW). If the level $E_0$ is brought into a coincidence with the Fermi level by a negative gate bias (i.e. $\delta E_f$=0, see FIG. 7D, the tunneling transparency approaches resonant values close to unity, and resonant Josephson tunneling occurs. At slightly higher gate biases, the supercurrent amplitude will drop abruptly due to increase of the entire barrier width (two InAlAs barriers plus the QW width). Thus, the gate biasing allows tuning the system to the resonant conditions corresponding to a maximum supercurrent. As it was estimated for the JTT, the channel depletion (and the resonance) will occur at $V_g$≈0.08 V, while just above this value the highest device sensitivity is expected.

Figure 7C:
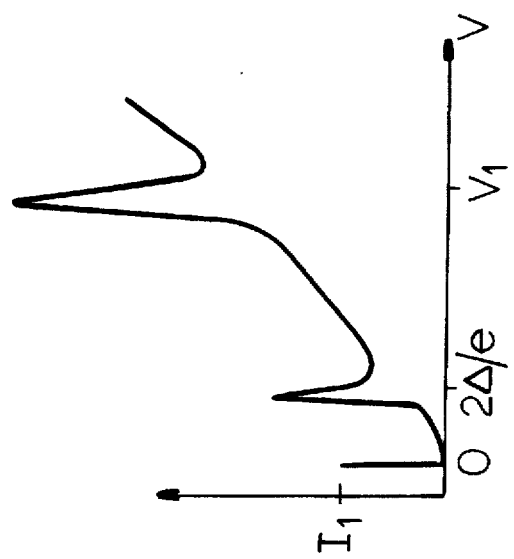
FIG. 7C is a graph of the I/V characteristic of the resonance tunneling Josephson transistor.
Figure 7D:
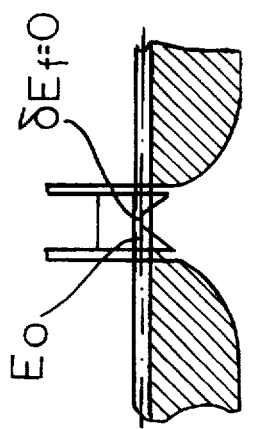
FIG. 7D is a band diagram of the first resonance.

The expected emitter-collector, I-$V_c$, characteristic of the RTJT is schematically shown in FIG. 7C. The bias $V_c$ switches the device from supercurrent to a single-particle tunneling region in the I-V curve (at $eV_c$=2∆) which, due to the resonance, is followed by a negative differential resistance. At higher voltages (V=$V_1$, see FIG. 7E), resonance with the first excited subband $E_1$ occurs resulting in another current peak. At this bias, one can expect a resonant enhancement of the AC Josephson effect.

As in the case of the JTT, the alternative way of the current modulation would be use of the side gating shown in FIG. 6. In this case the resonance arises when the Fermi level, lowered everywhere in the channel by negative gate bias, coincides with the ground state level in the QW.

Figure 8:
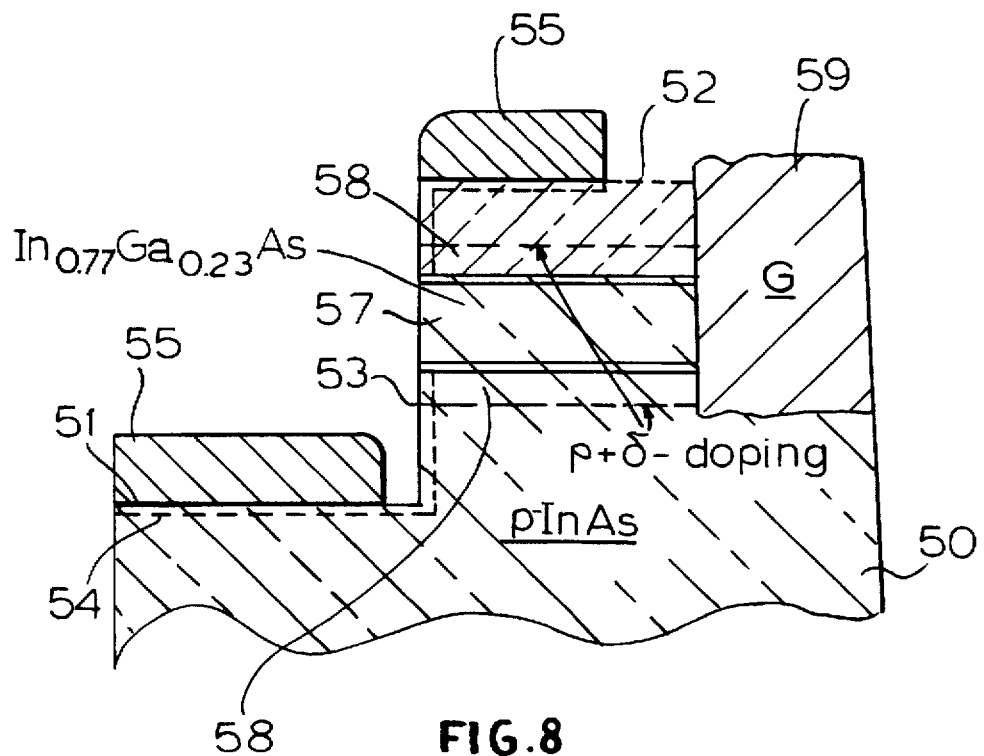
FIG. 8 is a cross sectional view similar to FIG. 7A for a resonance tunneling Josephson transistor with two δ-doping layers located away from the QW which is made of $In_{0.77}Ga_{0.23}As$.

In the embodiment of FIG. 8, which is another RTJT, the stepped body 50 has the plateaus 51 and 52 as described, the vertical side 53, the inversion layer 54 and the terminals 55 as well as the gate 59. In this embodiment, however, a layer of $In_{0.77}Ga_{0.23}As$ is provided at 57 and flanked by p+δ-doping as 58.

An alternative material for making the QW is strained $In_{0.77}Ga_{0.23}As$ layer in which the Fermi level at the surface is slightly below the conduction band edge, and hence there is no surface inversion layer. As preliminary experiments showed, 10 nm-thick layer of this material grown inside of the InAs remains strained. With this layer as a QW, there is no need for regrowth of the side layer. Due to the absence of the Fermi level pinning and depletion of the QW, the gate bias applied directly to the QW through the δ-doped p+layer will move the ground state level to the resonant position. Furthermore, to minimize additional electron scattering in the QW due to presence of the δ-doping, one can replace the p+layer inside of the QW by two δ-doped layers 5–10 nm away from the QW. The gate contact is attached to both layers, which are capable of efficient potential variation of the energy levels in the depleted QW as the gate bias is applied. Removal of the S-doping from the QW will enhance the electron mobility in the latter.

Gate control of the resonant tunneling process implies operation of a three-terminal superconductive switch. The important condition for realization of this switch is small broadening $\Gamma$ of the resonant level in the QW, namely, $\Gamma<2\Delta\approx3$ meV (for Nb). The parameter $\Gamma$ consists of three major components: life time broadening $\Gamma_1$, and broadening $\Gamma_2$ due to fluctuations of the QW width, basically, by a single monolayer δL, $\Gamma_2=4(\delta L/L)E_0$ and level broadening induced by electronic scattering in the QW. The $\Gamma_1$ is determined by the tunneling transparency T of the resonant level: $\Gamma_1=E_0T$ (V. Goldman, D. Tsui and J. Cunningham Phys.Rev.B. 35, 9387, 1987). For T=0.1 and $E_0=10$ meV (L=20 nm) one obtains $\Gamma_1+\Gamma_2=1$ meV+0.3 meV=1.3 meV. Finally, one has to take into account level broadening due to electron scattering in the QW. For a reasonable mobility of $5 \cdot 10^4$ cm$^2$/V·s, one obtains $\Gamma_3=1$ meV. Thus the total broadening is $\Gamma=2.3$ meV$<2\Delta$. In this case, the supercurrent is expected to drop from its maximum value at V=0.08 V to low one at V≈0.08+4$\Gamma$/e≈0.09 V. This implies a transconductance in the range of ~1 S/mm. We emphasize however that to achieve such a high performance the total broadening should be lower or at least close to 2Δ. In this respect, NbN with 2Δ>5 meV is preferable as a superconductor material.

Figure 9A:
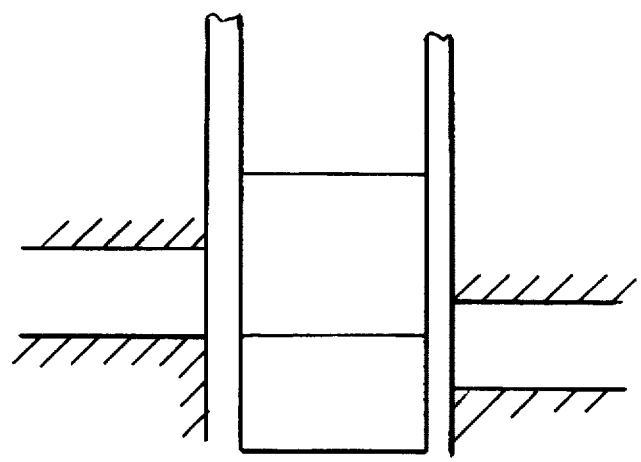
FIG. 9A is an energy diagram of a resonance tunneling Josephson transistor with unequal unique barrier thicknesses.
Figure 9B:
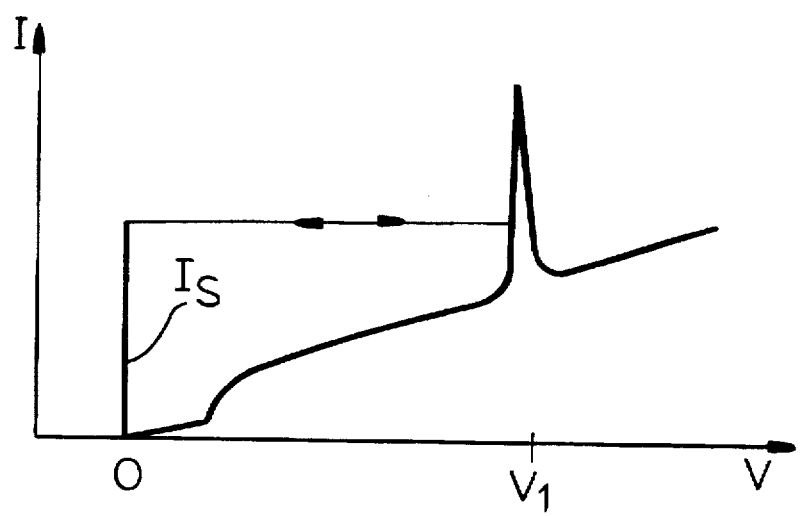
FIG. 9B is a graph of the I/V characteristic of this RTJT.

An intriguing situation arises when the barrier thicknesses are different. In this case, a true resonant tunneling condition exists only at V=0 while at eV≧2Δ it does not, as shown in FIG. 9A. As a result, the supercurrent (resonant) amplitude may exceed the amplitude of single particle (non resonant) current component. The supercurrent may switch to a voltage range on the I-V curve greater than 2Δ (see FIG. 9B). This feature would be extremely valuable for Josephson circuit applications.

I claim:

1. A superconductor/semiconductor heterostructure hybrid electronic device, comprising:

a p-InAs body with a stepped shape having a high plateau, a low plateau and a step side transverse to said plateaus and connecting same, said InAs body having a continuous inversion layer underlying said low plateau, extending alone said side and underlying said high plateau;

a first superconductive layer on said high plateau;

a second superconductive layer on said low plateau having a thickness less than a height of said side whereby an electron-conducting channel is formed between said superconductive layers through said inversion layer;

a gate for controlling electron flow along said channel; and an n⁺InAlAs or AlSb side layer on said side between said plateaus, said first superconductive layer overhanging said side and said n⁺InAlAs or AlSb layer on said side, said superconductive layers are Nb layers, said gate being a conductor embedded in said InAs body and connected by a conducting δ doped layer extended to the side channel.

2. A superconductor/semiconductor heterostructure hybrid electronic device, comprising:

a p-InAs body with a stepped shape having a high plateau, a low plateau and a step side transverse to said plateaus and connecting same, said InAs body having a continuous inversion layer underlying said low plateau, extending along said side and underlying said high plateau;

a first superconductive layer on said high plateau;

a second superconductive layer on said low plateau having a thickness less than a height of said side whereby an electron-conducting channel is formed between said superconductive layers through said inversion layer; and two InAlAs or AlSb barriers buried in said body above and below an δ-doped layer to form a double barrier resonant tunneling structure perpendicular to said step and extending to said step whereby the device forms a Josephson resonant tunneling transistor.

3. A superconductor/semiconductor heterostructure hybrid electronic device, comprising:

a p-InAs body with a stepped shape having a high plateau, a low plateau and a step side transverse to said plateaus and connecting same, said InAs body having a continuous inversion layer underlying said low plateau, extending along said side and underlying said high plateau;

a first superconductive layer on said high plateau;

a second superconductive layer on said low plateau having a thickness less than a height of said side whereby an electron-conducting channel is formed between said superconductive layers through said inversion layer;

two InAlAs or Alsb barriers buried in said body and forming a double-barrier resonant tunnel structure flanked by a p⁺δ-doped region; and an $In_{0.77}Ga_{0.23}As$ layer as a quantum well between said barriers buried in said body below said inversion layer of said high plateau, interrupting said inversion layer alone said side and flanked by p⁺δ-doped regions of said body, whereby the device forms a low electron scattering growth-free Josephson resonant tunneling transistor.

* * * * *